United States Patent
Ohtani et al.

(10) Patent No.: US 6,881,475 B2
(45) Date of Patent: Apr. 19, 2005

(54) AMORPHOUS CARBON COATED TOOL AND FABRICATION METHOD THEREOF

(75) Inventors: Satoshi Ohtani, Kyoto (JP); Naoto Okazaki, Kyoto (JP); Kiyoshi Ogata, Kyoto (JP); Haruyo Fukui, Itami (JP); Miki Irie, Itami (JP); Yoshiharu Utsumi, Itami (JP); Hisanori Ohara, Itami (JP); Hideki Moriguchi, Itami (JP); Akihiko Ikegaya, Itami (JP); Keiichi Tsuda, Itami (JP); Makoto Setoyama, Kyoto (JP)

(73) Assignees: Sumitomo Electric Industries, Ltd, Osaka (JP); Nissin Electric Co., Ltd., Kyoto (JP)

( * ) Notice: Subject to any disclaimer, the term of this patent is extended or adjusted under 35 U.S.C. 154(b) by 365 days.

(21) Appl. No.: 10/167,770

(22) Filed: Jun. 11, 2002

(65) Prior Publication Data

US 2003/0049083 A1 Mar. 13, 2003

(30) Foreign Application Priority Data

Jun. 13, 2001 (JP) ........................................ 2001-178832

(51) Int. Cl.[7] .............................................. B23B 27/14
(52) U.S. Cl. ...................... 428/216; 428/156; 428/174; 428/212; 428/336; 428/408; 428/469; 428/472; 428/698; 51/307; 51/309; 407/119
(58) Field of Search ................................ 428/408, 698, 428/336, 216, 472, 469, 325, 174, 156, 212; 407/119; 51/307, 309

(56) References Cited

U.S. PATENT DOCUMENTS 4,842,937 A * 6/1989 Meyer et al. ................ 428/408
5,474,816 A 12/1995 Falabella (Continued)

FOREIGN PATENT DOCUMENTS

| EP | 561641 | * | 9/1993 |
| EP | 1067211 | | 1/2001 |
| EP | 724023 | * | 7/2001 |
| JP | 01252752 | | 10/1989 |
| JP | 07018415 | | 1/1995 |
| JP | 07085465 | | 3/1995 |
| JP | 07192254 | | 7/1995 |
| JP | 08119774 | | 5/1996 |
| JP | 09314405 | | 12/1997 |
| JP | 10025565 | | 1/1998 |
| JP | 11018809 | | 1/1999 |
| JP | 11086275 | | 3/1999 |
| JP | 2000-176705 | | 6/2000 |
| JP | 2001-062605 | | 3/2001 |

OTHER PUBLICATIONS

Lifshitz "Hydrogen free amorphous carbon films: correlation between growth conditions and properties" Diamond and Related Materials 5 (1996) 388–400.

(Continued)

*Primary Examiner*—Archene Turner
(74) *Attorney, Agent, or Firm*—W. F. Fasse; W. G. Fasse

(57) ABSTRACT

An amorphous carbon coated tool includes a base material of WC base cemented carbide, and an amorphous carbon film formed on this base material. The cobalt content in the base material is at least 12% by mass. The maximum thickness of the amorphous carbon film is at least 0.05 μm and not more than 0.5 μm at the cutting edge. The amorphous carbon film is deposited with graphite as the source material by physical vapor deposition in an atmosphere substantially absent of hydrogen. The amorphous carbon film coated tool superior in wear resistance and adhesion resistance is preferably applicable to rotating tools such as drills, end mills and reamers, indexable inserts used for milling cutters and turning tools, and cutting-off tools such as cutters, knives, or slitters.

23 Claims, 4 Drawing Sheets

U.S. PATENT DOCUMENTS

| | | | |
|---|---|---|---|
| 5,482,602 A | | 1/1996 | Cooper et al. |
| 5,562,982 A | * | 10/1996 | Hiwatashi ................... 428/336 |
| 5,567,512 A | * | 10/1996 | Chen et al. ................... 428/336 |
| 5,733,668 A | | 3/1998 | Kameoka et al. |
| 5,763,087 A | | 6/1998 | Falabella |
| 6,110,329 A | | 8/2000 | Holleck et al. |
| 6,110,584 A | * | 8/2000 | Hiratsuka et al. ............ 428/408 |
| 6,139,964 A | * | 10/2000 | Sathrum et al. ............. 428/408 |
| 6,284,376 B1 | | 9/2001 | Takenouchi et al. |
| 6,726,993 B1 | * | 4/2004 | Teer et al. ................... 428/216 |

OTHER PUBLICATIONS

English Translation (computer-generated) of JP 2001-062605, published Mar. 13, 2001.

J.P. Hirvonen et al.; "Characterization and Unlubricated Sliding of Ion–Beam–Deposited Hydrogen–Free Diamond–Like Carbon Films", Wear, Lausanne, CH. vol. 141, 1990, pp. 45–58, XP000570574.

B. F. Coll et al., "Diamond–Like Carbon Films Synthesized by Cathodic Arc Evaporation", Thin Solid Films, Elsevier–Sequoia S. A. Lausanne, CH., vol. 209, No. 2, Mar. 30, 1992; pp. 165–173 XP000362002, ISSN: 0040–6090.

S. Santavirta et al., "Some Relevant Issues Related to the Use of Amorphous Diamond Coatings for Medical Applications", Diamond and Related Materials, Elsevier Science Publishers, Amsterdam, NL, vol. 7, No. 2–5, Feb. 1, 1998, pp. 482–485, XP004115090, ISSN: 095–9635.

J. Ullman, "Low Energy Ion Assisted Carbon Film Growth: Methods and Mechanisms", Nuclear Instruments & Methods in Physics Research, Section—B: Beam Interactions With Materials and Atoms, North–Holland Publishing Company, Amsterdam, NL, vol. 127–128, May 1, 1997, pp. 910–917, XP004096874, ISSN: 0168–583X.

Y. Lifshitz, "Diamond–like Carbon—Present Status", Diamond and Related Materials, Elsevier Science Publishers, Amsterdam, NL., vol. 8, No. 8–9, Aug. 1999, pp. 1659–1676, XP004254004, ISSN: 0925–9635.

M. Hakovirta, "Hardmetal Woodcutting Tool Tips Coated With Tetrahedral Amorphous Carbon", Diamond and Related Materials, Elsevier Science Publishers, Amsterdam, NL., vol. 8, No. 7, Jul. 1999, pp. 1225–1228, XP004253920, ISSN: 0925–9635.

R. Kalish et al., "Thermal Stability and Relaxation In Diamond–Like–Carbon. A Raman Study of Films with Different SP3 Fractions (TA–C to A–C)", Applied Physics Letters, American Institute of Physics, New York, US, vol. 74, No. 20, May 17, 1999, pp. 2936–2938, XP00083705, ISSN: 0003–6951.

M. Bonelli et al., "Structural and mechanical properties of ta–C films grown by pulsed laser deposition", Europhysics Letters, May 15, 2000, Eur. Phys. Soc. by EDP Sciences and Soc. Italiana Fisica, France, vol. 50, No. 4, pp. 501–506, XP008027117, ISSN: 0295–5075.

* cited by examiner

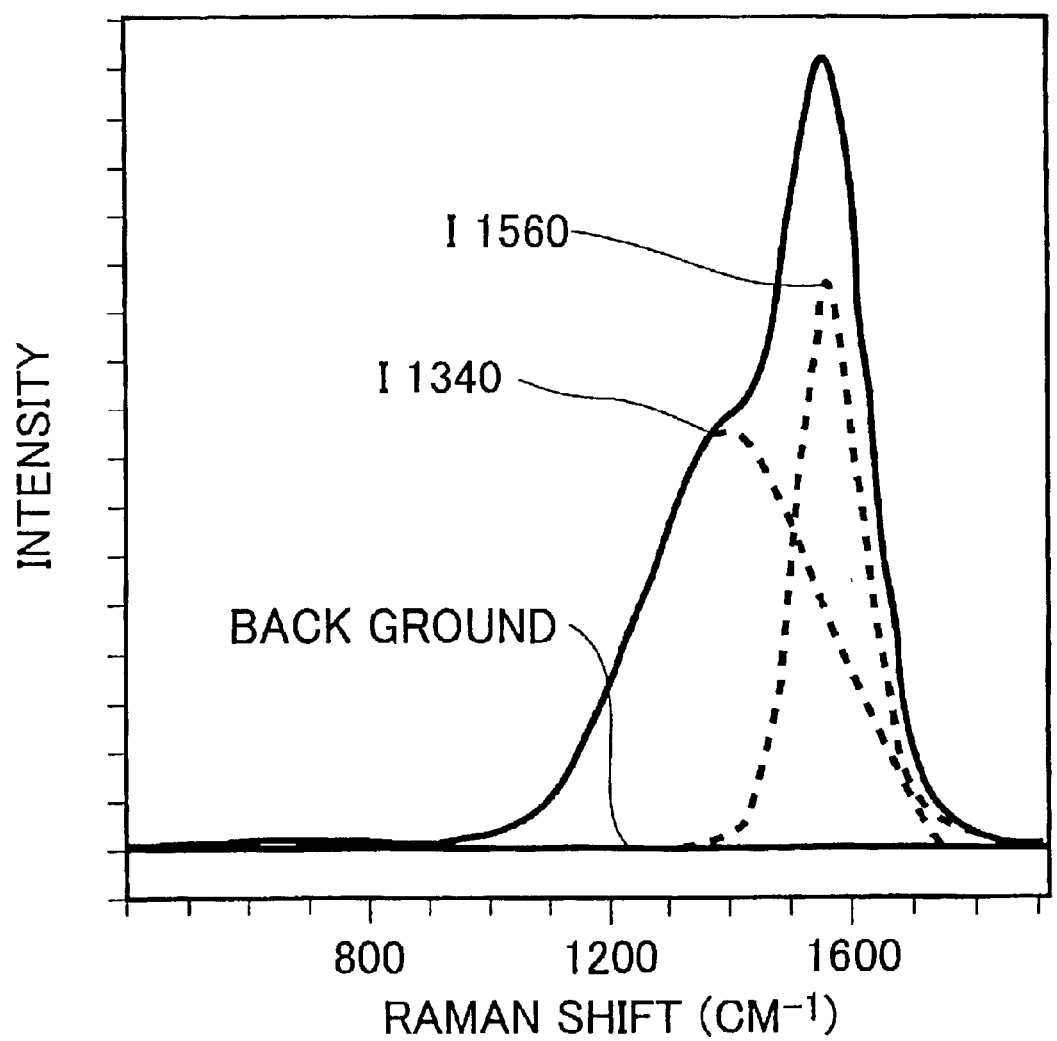

AMORPHOUS CARBON COATED TOOL AND FABRICATION METHOD THEREOF

CROSS-REFERENCE TO RELATED APPLICATION

This application is related to U.S. application Ser. No. 10/167,751 filed Jun. 11, 2002.

BACKGROUND OF THE INVENTION

1. Field of the Invention

The present invention relates to a tool having a wear-resistant and adhesion-resistant amorphous carbon film formed at the surface of rotating tools (drills, end mills, reamers, and the like), an indexable insert used for milling cutters and turning tools, and cutting-off tools (cutters, knives, slitters and the like). The present invention also relates to a method of fabricating such a tool.

2. Description of the Background Art

The conventional requirements with respect to cutting tools include the capability of increasing the lifetime of the tool by minimizing any damage at its surface and carrying out machining at high efficiency as well as finishing the workplace with high quality (maintaining the surface configuration, the hardness of the parent material, the dimension accuracy and the like).

Recently, there is a strong demand for the development of a tool that reduces the cutting resistance and a tool without degradation in the lifetime and cutting efficiency even if the amount of oil agents for cutting is reduced from the standpoint of protecting the environment and saving energy.

The material of the workpiece now includes a variety of types. In the case where the workpiece includes soft metal such as aluminum alloy, a non-ferrous metal such as titanium, magnesium, or copper, an organic material, or a material including hard particles such as graphite, or in the case of working on a printed circuit board or bimetallic cutting of an iron type material and aluminum, problems are noted such as residuals adhering to the cutting edge of the cutting tool to increase the cutting resistance, and, in some cases, cause chipping at the cutting edge. The wear of the tool used on such specific workpieces has become more significant.

The demand for reducing the cost drastically without degrading the performance is strong in the field of metal machining.

In the specific field of working on aluminum, aluminum alloy, or organic material, the diamond tool has been traditionally used. As to such tools having a diamond film formed on the base, the growing rate of the diamond film differs greatly depending upon the crystal orientation. The surface asperity is so great that the complex shape of the tool must be polished if the tool is to be used for high-precision processing.

Since diamond is the hardest available material, grinding of a diamond film requires the usage of diamond that is extremely expensive. This attributes to the increase in cost.

Furthermore, since a crystal growth speed varies in the crystal direction drastically, to get a smooth grinding surface, a film of 20–30 $\mu$m in thickness must be prepared in the case of a diamond film, as compared to the general thickness of 2–3 $\mu$m for a ceramics coated film such as TiN, obtained by PVD (Physical Vapor Deposition) coating. Formation of a diamond film is carried out while graphite that is deposited at the same time is removed by etching. Therefore, the film growth rate becomes as slow as less than $\frac{1}{10}$ the rate of normal PVD coating. There was a problem that the fabrication cost including the coating process is extremely high.

As to tools made by brazing a diamond sintered compact on a base, it is difficult to fabricate the tools of complicated shape or the tools as fine as several millimeters in diameter.

Japanese Patent Laying-Open No. 2000-176705 discloses a tool member having a hard material including TiN, TiCN, TiAlN, $Al_2O_3$ or a combination thereof coated, and then further coated with a hard carbon type lubricating film. In order to form an economic hard carbon type lubricated film that has stable durability and suitable for mass production, the inventors in this publication propose formation of an intermediate layer of a component including silicon and carbon or silicon, carbon and nitrogen, followed by a formation of a silicon layer of at least 0.02 $\mu$m and not more than 0.5 $\mu$m in thickness under and in contact with the bottom of the intermediate layer.

The hard carbon coated film at the outermost surface layer disclosed in this publication inevitably includes hydrogen atoms in the film since formation is conducted through ion plating and plasma CVD (Chemical Vapor Deposition) using hydrocarbon type gas. It is generally known that hydrogen atoms in hard carbon film are desorbed from the film at the temperature of at least approximately 350° C. in the atmosphere. Following desorption of hydrogen, the hard carbon coated film is modified into graphite. The hardness is significantly degraded. Such a coated film is not suitable for usage in a severe cutting environment.

SUMMARY OF THE INVENTION

In view of the foregoing, a main object of the present invention is to provide an amorphous carbon coated tool less vulnerable to adhesion of residual and chipping at the cutting edge when used in cutting soft metal, non-ferrous metal, organic material, material including hard particles, printed circuit boards, and in bi-metallic cutting of iron base material and soft metal material, and having temperature increase at the cutting edge suppressed by coating with amorphous carbon that has high heat conductivity to allow usage even under a severe cutting environment such as in dry cutting and high speed machining.

Another object of the present invention is to provide a method of fabricating such an amorphous carbon coated tool.

The above objects of the present invention are achieved by specifying the component of the base material and the thickness of the amorphous carbon film.

The amorphous carbon coated tool of the present invention includes a base material of WC base cemented carbide, and an amorphous carbon coated film covering at least the cutting edge on the base material. The base material has a cobalt content of not more than 12% by mass. The amount of hydrogen in the amorphous carbon film is not more than 5 atomic %. The maximum film thickness at the cutting edge of the amorphous carbon film is at least 0.05 $\mu$m and not more 0.5 $\mu$m.

The amorphous carbon coated tool of the present invention includes a base material of WC base cemented carbide, and an amorphous carbon coated film covering at least the cutting edge on the base material. The base material has a cobalt content of not more than 12% by mass. The amorphous carbon film is formed by physical vapor deposition with graphite as the source material under an atmosphere that is substantially absent of hydrogen. The maximum thickness at the cutting edge of the amorphous carbon film is at least 0.05 $\mu$m and not more 0.5 $\mu$m.

The method of fabricating an amorphous carbon coated tool of the present invention includes the steps of supporting in a vacuum vessel a base material of WC base cemented carbide, and applying zero or negative direct-current bias to the base material and vaporizing the graphite that is the source material to form an amorphous carbon film. The maximum thickness of the amorphous carbon film at the cutting edge is controlled to be 0.05 to 0.5 μm.

BRIEF DESCRIPTION OF THE DRAWINGS

FIG. 4 represents a Raman spectrum of a conventional amorphous carbon coated film.

DESCRIPTION OF THE PREFERRED EMBODIMENTS

Figure 1:
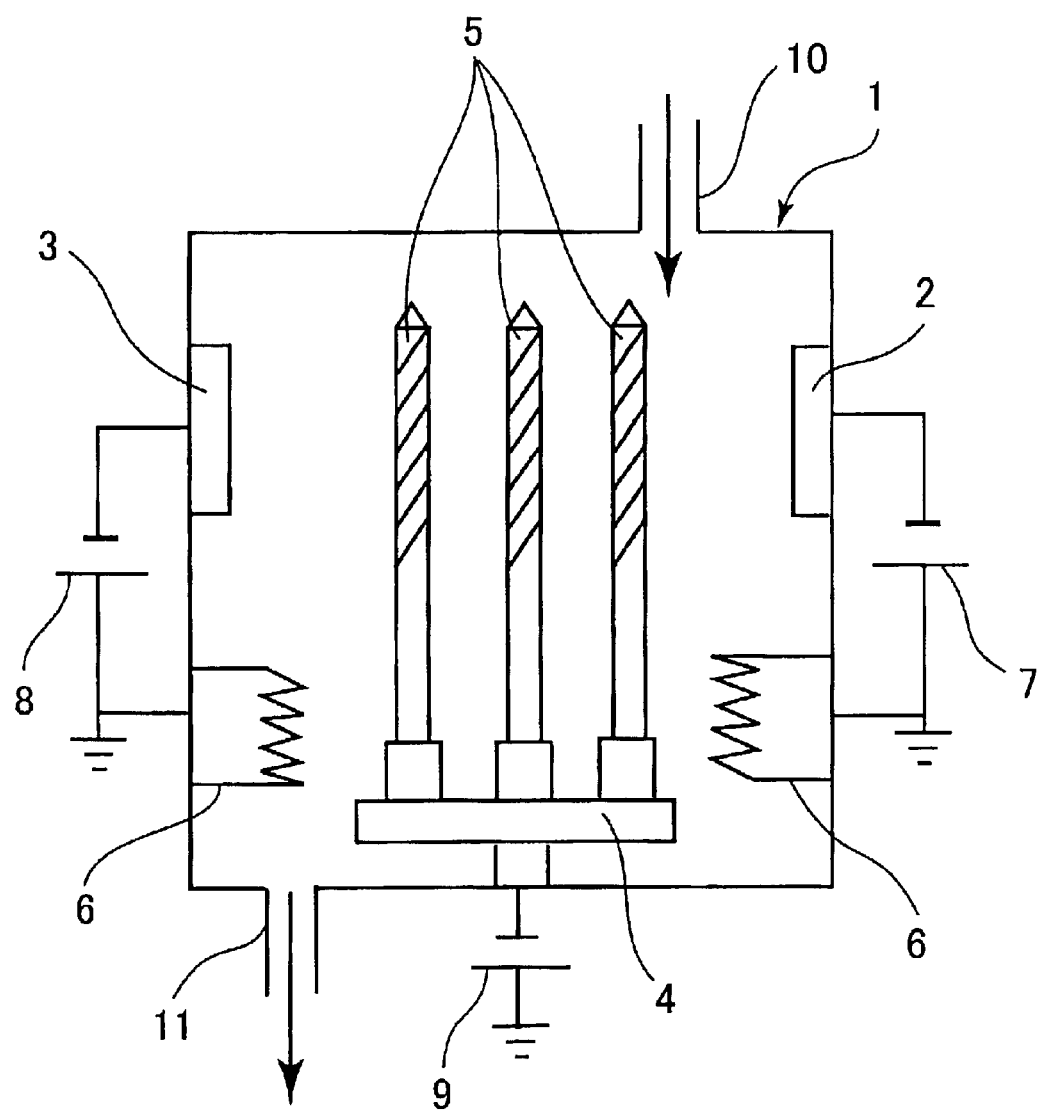
FIG. 1 is a schematic diagram of a film deposition apparatus of the present invention.

The structural elements of the present invention will be described in detail hereinafter.

WC Base Cemented Carbide Base Material

The WC base cemented carbide is formed of a hard phase with tungsten carbide (WC) as the main component, and a bonded phase with iron group metal such as cobalt as the main component. The reason why the amount of cobalt included in the WC base cemented carbide is defined is set forth below. If the amount of cobalt is great, the toughness of the base material is increased to improve the chipping resistance property at the cutting edge of the cemented base material. However, if a great external force is applied on the cutting edge, the hard amorphous carbon film cannot follow the deformation of the base material. The amorphous carbon film will peel off from the cemented base material at the interface. In order to stabilize the cutting performance without any delamination, the amount of cobalt is preferably set to not more than 12% by mass. Further preferably, the cobalt content in the base material is at least 3% by mass and not more than 7% by mass.

The average crystal grain size of tungsten carbide after the base material is subjected to sintering is preferably at least 0.1 μm and not more than 3 μm. Any particle smaller than 0.1 μm in average crystal grain size cannot be easily identified by the current evaluation method. If the average crystal grain size exceeds 3 μm, the large tungsten carbide particles in the base material will fall off to induce large chipping when the film is abraded.

Also, preferably in the base material is included at least 0.01% by mass and not more than 3% by mass a compound formed of at least one type of element selected from the group consisting of a metal element from Groups IVa, Va, and VIa of the periodic table, and at least one type of element selected from the group consisting of carbon and nitrogen. By containing such elements, the crystal particle growth of tungsten carbide during sintering can be suppressed. A specific example of preferable added compound includes (Ta, Nb) C, VC, $Cr_2C_2$ and NbC.

Amorphous Carbon Film

An amorphous carbon film includes films such as a hard carbon film, diamond-like carbon film, DLC film, and a-C:H, i-carbon film. The amorphous carbon film of the present invention is characterized in the following issues.

Deposition Method

In the present invention, an amorphous carbon film is formed with graphite as the source material by physical vapor deposition under an atmosphere absent of hydrogen. The film has a high hardness equal to that of diamond, and superior in wear resistance for a cutting tool. An amorphous carbon film with hydrogen carbon as the source material will include hydrogen, and differs from the amorphous carbon film of the present invention.

The amorphous carbon film of the present invention is formed only of carbon atoms with the exception of impurities inevitably included during film deposition. Since the ratio of $sp^3$ bonding becomes higher than that of an amorphous carbon film including hydrogen, the hardness is improved. Also, the oxidation resistance is improved up to approximately 600° C. equal to that of diamond. Even if film deposition is effected under an atmosphere that is substantially absent or free of hydrogen, a slight amount of hydrogen, not more than 5 atomic %, may be included in the resulting amorphous carbon film. It is likely that this is caused by the hydrogen and moisture remaining in the film deposition apparatus being introduced into the amorphous carbon film due to the vacuum during deposition.

Regarding the physical vapor deposition method with graphite as the original source material, the cathode arc ion plating method, laser ablation method, sputtering method and the like generally used in the field of industry are suitable by virtue of the high deposition rate. The problem of the fabrication cost noted in the case where the conventional diamond film is used is eliminated. The cathode arc ion plating method is particularly preferable for film deposition from the standpoint of the adherence and the hardness of the coated film. It is noted that the ionization of the source material is high in the cathode arc ion plating method. Therefore, an amorphous carbon film is formed by directing carbon ions onto the base material. Thus, a film of high $sp^3$ bond ratio that is compact and that has high hardness is obtained. Accordingly, the lifetime of the tool can be improved greatly.

It is desirable that temperature of the base material on the occasion of forming film is more than 50° C., and less than 350° C., more desirably less than 200° C., and most desirably less than 150° C. When temperature of the base material exceeds 350° C., graphite tends to be easily deposited. The temperature of the base material rises when carbon ion is irradiated on the base material to form the amorphous carbon film. Therefore, the temperature may rise to the efficient degree without heating. The temperature of the base material can also be adjusted by heating and cooling.

Macro-Particle Density

Hard particles called "macro-particle" are present at the surface of an amorphous carbon film formed by cathode arc ion plating. A smaller macro-particle density at the surface of the film is desirable since the cutting resistance will become lower. The macro-particle density is not more than $3 \times 10^5$ particles/$mm^2$, more preferably not more than $1.5 \times 10^5$ particles/$mm^2$. The optimum macro-particle density is of course 0 particle/$mm^2$. If the macro-particle density is greater than $3 \times 10^5$ particles/$mm^2$, the residual of the workpiece will adhere to the macro-particles to increase the cutting resistance.

The density of the macro-particles can be evaluated by observation through an SEM (Scanning Electron Microscope). In order to facilitate observation of the macro-particles, SEM observation should be conducted after vapor deposition of noble metal such as Pt or Pd on the surface of the sample by ion-sputtering. The density is to be obtained by counting the number of macro-particles on a photograph of the sample surface taken at the magnification of at least 1000 times.

Figure 2:
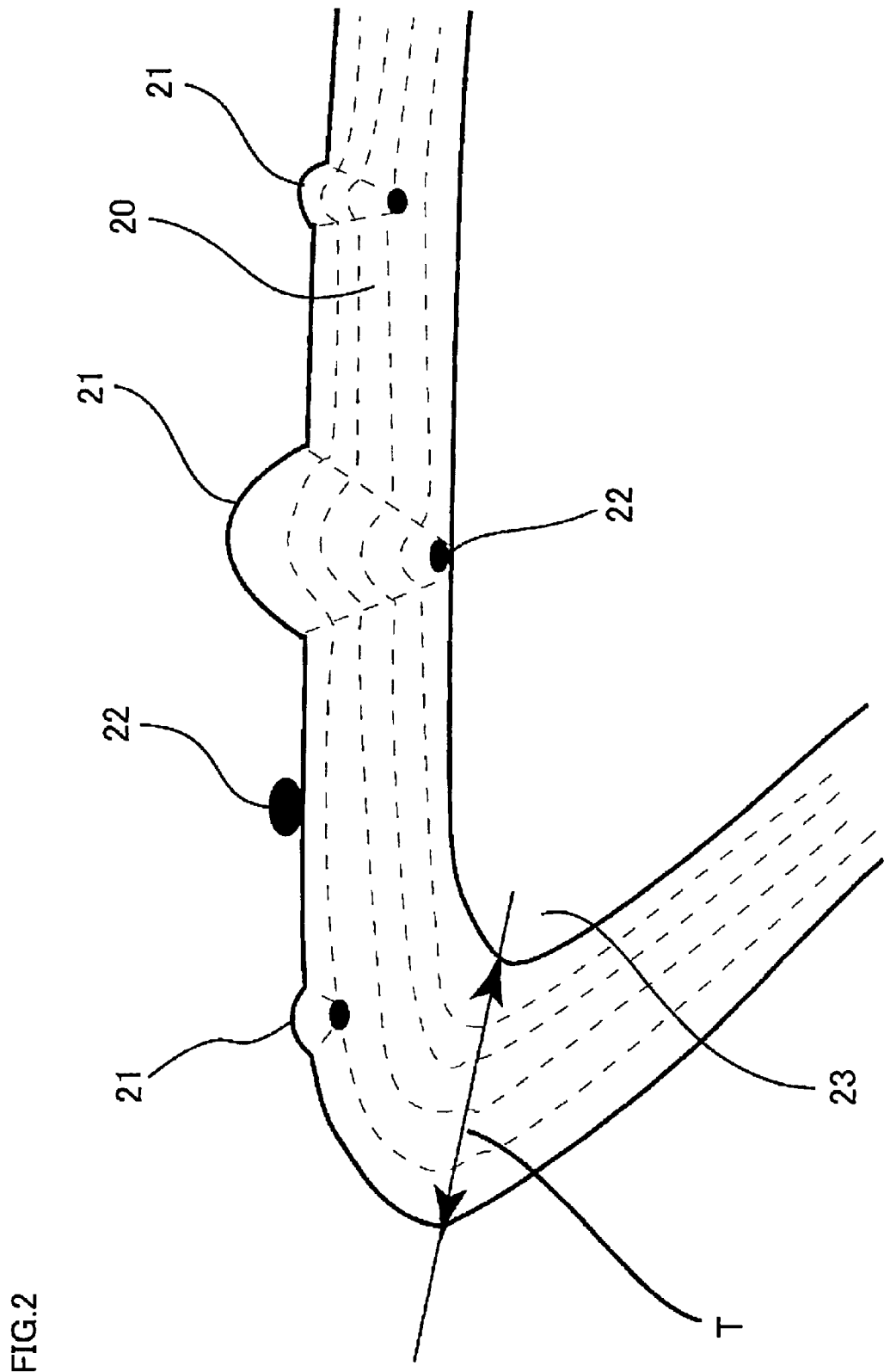
FIG. 2 is a sectional view of a cutting edge of a tool of the present invention.

FIG. 2 is a sectional view of an amorphous carbon coated plane 20 to show the growth of a macro-particle 21. Amorphous carbon 20 is applied on a cutting edge 23 of a tool. Graphite particles 22 float and adhere to the coated plane during the process. Round particles 21 of various diameters can be observed at the surface through an SEM. However, such particles are not desirable in the present invention. It is assumed that graphite particles 22 are present at various thickness sites of amorphous carbon 20 as shown in FIG. 2, since graphite particles 22 are scattered in the film deposition process.

Furthermore, in order to improve the surface roughness of the amorphous carbon film, appropriate measures to prevent scattering of particles from the graphite material can be taken. For example, growing a film through low energy or using a filter by a magnetic field can be used.

Surface Roughness

The surface roughness of the amorphous carbon film is desirably at least 0.002 μm and not more than 0.05 μm in Ra representation defined by the standards of JIS B0601. From the standpoint of a cutting tool, the surface roughness Ra should be as small as possible. In practice, a surface roughness Ra of zero cannot be achieved. It is found that the adhesion at the cutting edge is improved to increase the cutting performance when Ra is 0.05 μm or below as a result of various cutting experiments. Furthermore, the surface roughness is preferably at least 0.02 μm and not more than 0.5 μm in Ry representation defined by the standards of JIS B0601. If Ry exceeds 0.5 μm, any projection on the amorphous carbon film will become the adhesion origin of residuals to result in higher cutting resistance.

Thickness

The reason why the maximum film thickness of the amorphous carbon film at the cutting edge of a tool is set to 0.05 μm to 0.5 μm is set forth below. If the maximum film thickness is less than 0.05 μm, the wear resistance is degraded. If the maximum film thickness exceeds 0.5 μm, the internal stress accumulated at the coated film will be increased to facilitate delamination, or cause chipping of the coated film. By setting the film thickness to not more than 0.5 μm, the size and density of the macro-particles at the surface can be reduced. There is the advantage that the surface roughness can be suppressed to not more than 0.05 μm in Ra representation and not more than 0.5 μm in Ry representation. The amorphous carbon film is thicker at the cutting edge of the tool as indicated by T in FIG. 2. The performance is improved by reducing this thickness. Thus, the maximum thickness T at the cutting edge of the amorphous carbon film corresponding to cutting is preferably at least 0.05 μm and not more than 0.25 μm from the standpoint of lower adhesion.

Hardness

The Knoop hardness of the amorphous carbon film is preferably at least 20 GPa and not more than 50 GPa. If the hardness is lower than 20 GPa, the wear resistance is degraded. If the hardness exceeds 50 GPa, the chipping resistance at the cutting edge is reduced. Further preferably, the Knoop hardness of the amorphous carbon film is at least 25 GPa and not more than 40 GPa.

Raman Spectrum

It is extremely difficult to identify the film structure of the amorphous carbon film due to the amorphous characteristic thereof. As a result of evaluating various amorphous carbon films, it was found that there is difference in the obtained Raman spectrum reflecting the change in structure by Raman spectroscopic analysis.

Figure 3:
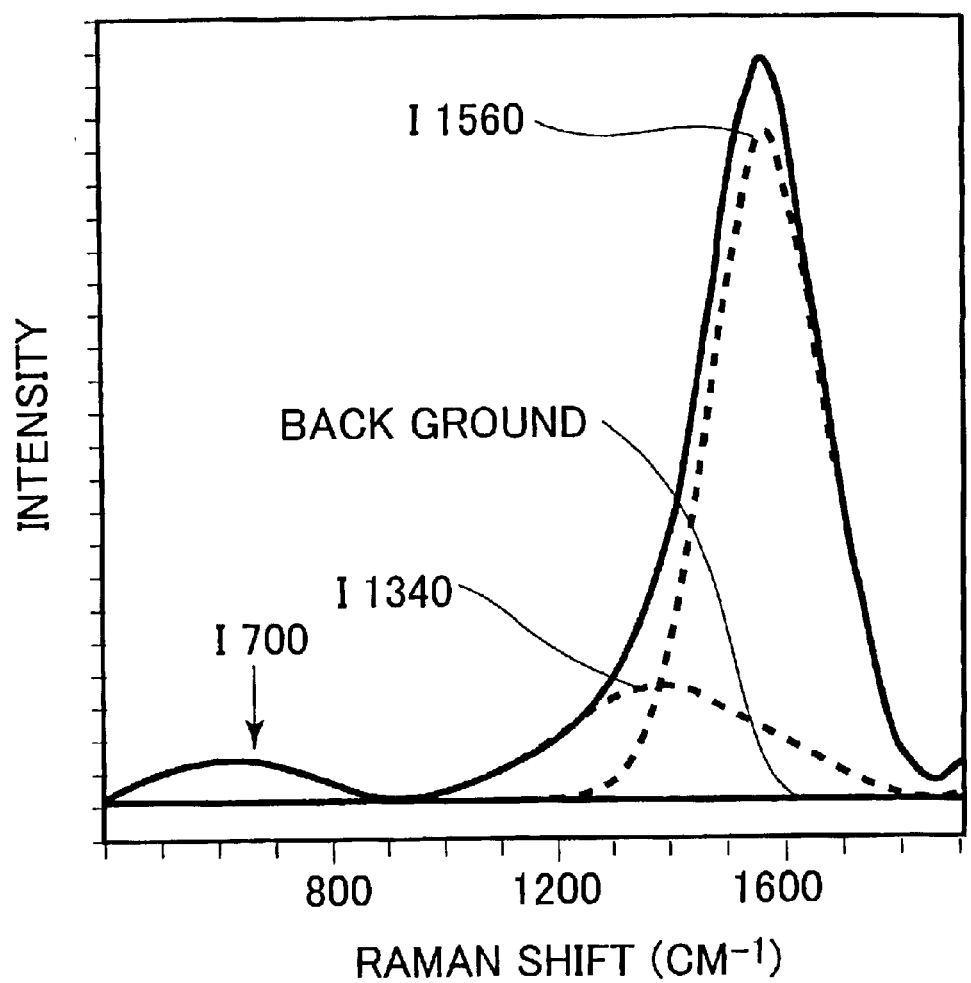
FIG. 3 represents the Raman spectrum of an amorphous carbon coated film of the present invention.

FIG. 3 represents the Raman spectrum of the amorphous carbon of the present invention whereas FIG. 4 represents the Raman spectrum of conventional amorphous carbon that includes hydrogen. These spectra are obtained by Raman spectroscopic analysis using argon gas laser having a wavelength of 514.5 nm. In FIG. 4, the solid line indicates the measured result. A bulge is observed in the vicinity of 1340 $cm^{-1}$. There is no peak in the vicinity of 700 $cm^{-1}$.

In order to divide the obtained spectrum into two partial spectra or spectral components, the background is removed from the spectral waveform. Assuming that the spectrum with a bulge is formed by two Gaussian functions that are superimposed or added, approximation is conducted by the nonlinear least-square method to obtain two separated peaks. The chain dotted line indicates the result. The height of the peak with the center about 1340 $cm^{-1}$ i.e indicated by I1340 whereas the height of the peak about 1560 $cm^{-1}$ is indicated by I1560. Referring to the Raman spectrum of the present invention shown in FIG. 3, a bulge in the vicinity of 1340 $cm^{-1}$ is not easily perceivable in the solid line. There is a wide peak in the vicinity of 700 $cm^{-1}$. The chain dotted line in FIG. 3 shows the peak separation result carried out in a manner similar to that described above. It is appreciated that the height of the peak of I1340 is lower in FIG. 3 than in FIG. 4. The height of the peak in the vicinity of 700 $cm^{-1}$ is indicated by I700. Similarly, the value corresponding to integration of respective peaks is represented as, for example, S700.

A total of three peaks are observed in the amorphous carbon film of the tool of the present invention according to FIG. 3, i.e. from wave number 400 $cm^{-1}$ to 1000 $cm^{-1}$, in the vicinity of 1340 $cm^{-1}$, and in the vicinity of 1560 $cm^{-1}$. In contrast, no peak is observed at the lower wave number side of 400 $cm^{-1}$ to 1000 $cm^{-1}$ in the conventional coated film containing hydrogen according to FIG. 4. By taking a coated film structure having a peak in the range between 400 $cm^{-1}$ and 1000 $cm^{-1}$ in wave number, hardening is induced to improve the wear resistance. Therefore, it is desirable to have a peak in the range of at least 400 $cm^{-1}$ and not more 1000 $cm^{-1}$ in wave number.

When the intensity ratio (I700/I1340) of the peak intensity located between at least 400 $cm^{-1}$ and 1000 $cm^{-1}$ in wave number (I700) to the peak intensity located in the vicinity of 1340 $cm^{-1}$ (I1340) is at least 0.01 and not more than 2.5, the wear resistance is improved. It is possible that the film hardness is improved by the small-size $sp^2$ bond and the increase of $sp^3$ bond with distortion.

Although the peak intensity (height) is used here, the same applies to the peak integrated intensity ratio. The intensity ratio (S700/S1340) of the integrated intensity of the peak located in the range from 400 $cm^{-1}$ to 1000 $cm^{-1}$ in wave number (S700) to the integrated intensity of the peak located in the vicinity of 1340 $cm^{-1}$ (S1340) is preferably at least 0.01 and not more than 2.5. If the peak intensity ratio is less than 0.01, the wear resistance is equal to that of the conventional coated film. Although various film deposition experiments were carried out, a peak intensity ratio exceeding 2.5 could not be obtained by the experiments carried out, as will be described below.

If the intensity ratio (I1340/I1560) of the peak intensity located in the vicinity of 1340 $cm^{-1}$ (I1340) relative to the peak intensity located in the vicinity of 1560 $cm^{-1}$ (I1560)

is at least 0.1 and not more than 1.2, high wear resistance is exhibited. The ratio of the intensity (I1340) of the peak located in the vicinity of 1340 cm⁻ to the intensity (I1560) of the peak located in the vicinity of 1560 cm$^{-1}$ is also interpreted as an sp$^2$/sp$^3$ representing the presence of the carbon bond status in the coated film. Although these values of the peak intensity ratio do not directly indicate the contained amount of sp$^2$, a relative classification of the coated film structure can be conducted. It was found that the hardness is increased when the intensity of the peak located in the vicinity of 1560 cm$^{-1}$ is high. In other words, the wear resistance is improved when the sp$^3$ bond characteristic is stronger. In addition to the peak intensity, the intensity ratio (S1340/S1560) of the integrated intensity of the peak located in the vicinity of 1340 cm$^{-1}$ (S1340) to the integrated intensity of the peak located in the vicinity of 1560 cm$^{-1}$ (S1560) is to be at least 0.3 and not more than 3.

When the peak located in the vicinity of 1560 cm$^{-1}$ is present in a range of at least 1560 cm$^{-1}$ and not more than 1580 cm$^{-1}$, high wear resistance can be realized. The peak position in the Raman spectrum is affected by the stress in the coated film. In general, the peak in the Raman spectrum shifts to the higher wave number side when the stress in the coated film is high at the compressive side. In contrast, the peak in the Raman spectrum shifts to the lower wave number side when the stress in the coated film is high at the extension side. It was found that the wear resistance is improved when the stress in the coated film is high at the compressive side.

Interference Colors

The amorphous carbon film coated in conventional art is opaque in the visible region and has the color of brown to black. The amorphous carbon film of the tool of the present invention is transparent in the visible region, and exhibits interference color.

Exhibiting interference color implies that sp$^3$ bond component in the amorphous carbon film is extremely great, and physical properties such as the refractive index, the optical bandgap and elastic modulus are closer to those of diamond than of the conventional amorphous carbon film. When the amorphous carbon film of the present invention is used for the tool, superior wear resistance and heat resistance are exhibited due to the high film hardness. Since the WC base cemented carbide which is the base material of the tool of the present invention is silver or gray close to silver in color, the tool of the present invention is characterized in the appearance of exhibiting interference color.

The interference color of the amorphous carbon film changes from (1) brown→(2) magenta→(3) violet→(4) blue-violet→(5) blue→(6) silver→(7) yellow→(8) red→(9) blue→(10) green→(11) yellow→(12) red, and then repeats the change from (8) red to (12) red thereafter, as a function of thicker film. The change of these colors is continuous with respect to difference in the film thickness. When the film is of a thickness intermediate therebetween, the color exhibited is the intermediate color therebetween.

The inventors of the present invention studied the results and found that the coated film exhibited the colors between (2) magenta to (10) green when the range of 0.05 μm to 0.5 μm is selected for the maximum film thickness at the cutting edge of the tool. The color of the coated film may be the rainbow color corresponding to a plurality of color tones instead of a single color. The tool of the present invention may have a conventional amorphous carbon film of the brown to black color formed on the amorphous carbon film presenting the above-described interference colors.

Interlayer

The tool of the present invention preferably has an interlayer provided between the base material and the amorphous carbon film to enhance the adherence of the amorphous carbon film.

Material

For the interlayer, at least one type of element selected from the group consisting of an element from Groups IVa, Va, VIa and IIIb of the periodic table and from Group IVb of the periodic table excluding C, or carbide of at least one type of element selected from the group consisting of these elements is suitable.

It is further desirable that the interlayer includes at least one type of element selected from the group consisting of elements Ti, Zr, Hf, V, Nb, Ta, Cr, Mo, W and Si, or carbide of at least one type of element selected from the group consisting of these elements. Since these metal elements facilitate a strong bond with carbon, the formation of an amorphous carbon film on the interlayer of these metal elements or metal carbide produces stronger adherence.

Thickness

The thickness of the interlayer is at least 0.5 nm and less than 10 nm. If the film thickness is thinner than this range, the interlayer cannot play its role. If the thickness exceeds this range, adherence of only a level equal to that of conventional art can be obtained. By forming such an extremely thin interlayer, significant adherence not achieved in prior art can be obtained. Thus, the lifetime of the tool can be extremely improved.

Mixed Composition Layer•Gradient Composition Layer

Adhesion can further be improved by providing a mixed composition layer whose composition of each coated film is mixed or a gradient composition layer whose composition is continuously varied between the interlayer and the amorphous carbon film. The mixed composition layer and the gradient composition layer are not necessarily distinguishable. When the fabrication conditions are switched from those of forming an interlayer to those for forming an amorphous carbon film, mixture occurs of the compositions of the interlayer and the amorphous carbon layer, whereby a mixed composition layer or gradient composition layer is formed. Although it is difficult to directly confirm such a composition layer, the results of XPS (X-ray Photoelectronic Spectroscopy), AES (Auger Electron Spectroscopy), and the like sufficiently support this presumption.

Tool Application

The amorphous carbon coated tool of the present invention is particularly suitable for working on aluminum and alloy thereof by virtue of the wear resistance and adhesion resistance. The tool of the present invention is most suitable to be used on non-ferrous material such as titanium, magnesium and copper. The tool of the present invention is also effective for cutting materials including hard particles such as graphite, organic material, and working on printed circuit boards and bi-metallic cutting of iron type material and aluminum. Furthermore, the tool of the present invention can be used in working on steel such as stainless steel and cast metal in addition to non-ferrous material by virtue of the high hardness of the amorphous carbon film.

Specific Examples of Tool

The amorphous carbon coated tool of the present invention can be used in an application including one type selected from the group consisting of a drill, an end mill, an indexable insert for end mill working, an indexable insert for a milling cutter, an indexable insert for a turning tool, a metal saw, a gear cutter, a reamer and a tap.

The foregoing and other objects, features, aspects and advantages of the present invention will become more apparent from the following detailed description of the present invention when taken in conjunction with the accompanying drawings.

An embodiment of an amorphous carbon coated tool of the present invention will be described specifically according to examples. It is to be understood that the method is not limited to that described here. An arbitrary method can be used as long as the film is deposited by PVD using graphite.

EXAMPLE 1

As the base, a φ8 mm drill made of WC base cemented carbide was prepared. This base includes 1% by mass of (Ta, Nb) C, and Co of a content indicated in Table 1 that will be described afterwards. The surface of this base was subjected to the well-known cathode arc ion plating method, whereby Samples 1–38 of amorphous carbon coated drills of the present invention shown in Table 1–Table 4 were prepared.

Referring to FIG. 1, a plurality of targets 2 and 3 are disposed in a film deposition apparatus 1. A drill formed of cemented carbide is attached to a base holder 4 that rotates between targets about the center point of respective targets. Power supplies 7 and 8 are adjusted to alter the discharging current of the cathode to coat amorphous carbon while controlling the vaporization of the target material.

The vacuum level in deposition apparatus 1 was set to an atmosphere of $2\times10^{-3}$ Pa while heating up to 100° C. using a base heater 6. Argon gas is then introduced. A voltage of –1000V is applied to base holder 4 through a bias power supply 9 while maintaining the atmosphere at $2\times10^{-1}$ Pa. Following an argon plasma cleaning process, the argon gas is discharged. The gas is introduced into deposition apparatus 1 through an inlet 10 and output through an outlet 11. By vaporizing and ionizing the graphite target through the vacuum arc discharge while introducing argon gas into deposition apparatus 1 at the rate of 100 cc/min., an amorphous carbon film is formed in contact on the cemented carbide drill. Here, the voltage from the bias power supply 9 was set to—several hundred V. At this time, the temperature of the base material was set up in 100° C.

Prior to deposition of amorphous carbon, some samples had the voltage of –1000V applied to base holder 4 through bias power supply 9 while the target of the metal element from Groups IVa, Va and VIa of the periodic table are vaporized and ionized to conduct metal ion bombardment. This surface etching process is effected to improve the adherence of the coated film.

Also, for some samples, a target selected from the group consisting of an element from Groups IVa, Va, VIa and IIIb of the periodic table and an element of Group IVb of the periodic table excluding C was vaporized and ionized, with or without hydrocarbon gas introduced, and a voltage of—several hundred V was applied to base holder 4 by bias power supply 9. As a result, an interlayer of this metal or of metal carbide was formed. The formation of an amorphous carbon film from an interlayer was effected by switching the target and atmosphere. At the time of this switching, slight mixture of the components of both layers generally occurs. It is therefore presumed that a mixed composition layer or gradient composition layer of the source material is present between the layers.

For the sake of comparison, coating drills of Comparative Examples 1–7 shown in Tables 5 and 6 were also prepared. Comparative Example 4, an amorphous carbon film was deposited at the surface of a cemented carbide drill identical to that described above using a general plasma CVD.

Each of the drills fabricated by the above-described method was used in a boring test according to the conditions in Table 7 (wetting condition by external oil feed). The thrust reduction with respect to a non-coat drill (evaluated based on the thrust resistance of Comparative Example 26) and the status of adhesion at the cutting edge were measured. The results of respective cutting tests are shown in Tables 2, 4 and 6. In Tables 1, 3 and 5, "Crystal grain size of WC" refers to the average grain size of WC after the base is sintered. The film thickness at the cutting edge was evaluated through SEM at the cutting edge cross section.

TABLE 1

| | Maximum film thickness at cutting edge (μm) | Cutting edge film color | Cobalt content (mass %) | Crystal grain size of WC | Surface roughness Ra (μm) | Surface roughness Ry (μm) | Macro-particle density (particles/mm$^2$) | Knoop hardness GPa | Metal ion bombard process | Interlayer |
|---|---|---|---|---|---|---|---|---|---|---|
| Sample 1 | 0.05 | Magenta | 5 | 1.2 | 0.002 | 0.02 | 24000 | 35 | No | No |
| Sample 2 | 0.15 | Yellow | 6 | 1.1 | 0.007 | 0.08 | 77000 | 34 | Yes | CrCx |
| Sample 3 | 0.25 | Blue | 5 | 1 | 0.015 | 0.12 | 125000 | 35 | Yes | Cr |
| Sample 4 | 0.50 | Green | 5 | 1.5 | 0.030 | 0.30 | 260000 | 34 | No | No |
| Sample 5 | 0.07 | Violet | 3 | 1.3 | 0.002 | 0.03 | 93000 | 32 | Yes | TiCx |
| Sample 6 | 0.20 | Red | 7 | 1.3 | 0.010 | 0.10 | 98000 | 29 | No | No |
| Sample 7 | 0.08 | Blue Violet | 12 | 1.2 | 0.003 | 0.04 | 114000 | 31 | Yes | Ti |
| Sample 8 | 0.18 | Red | 6 | 0.1 | 0.009 | 0.09 | 82000 | 30 | No | No |
| Sample 9 | 0.10 | Blue | 5 | 1 | 0.005 | 0.07 | 73000 | 35 | Yes | ZrCx |
| Sample 10 | 0.16 | Yellow | 5 | 2 | 0.007 | 0.06 | 77000 | 34 | No | No |
| Sample 11 | 0.07 | Violet | 5 | 3 | 0.003 | 0.04 | 73000 | 33 | Yes | Zr |
| Sample 12 | 0.21 | Red | 4 | 1 | 0.018 | 0.11 | 98000 | 30 | No | No |
| Sample 13 | 0.08 | Blue Violet | 6 | 1.2 | 0.003 | 0.03 | 99500 | 34 | Yes | HfCx |
| Sample 14 | 0.22 | Red | 6 | 1.1 | 0.020 | 0.18 | 112000 | 31 | No | No |
| Sample 15 | 0.10 | Blue | 5 | 1 | 0.005 | 0.06 | 84000 | 20 | Yes | Hf |
| Sample 16 | 0.16 | Yellow | 5 | 0.9 | 0.007 | 0.08 | 72000 | 25 | No | No |
| Sample 17 | 0.12 | Silver | 7 | 1.4 | 0.007 | 0.09 | 110000 | 50 | Yes | VCx |
| Sample 18 | 0.19 | Red | 5 | 1.1 | 0.015 | 0.12 | 98000 | 33 | No | No |

TABLE 1-continued

|  | Maximum film thickness at cutting edge (μm) | Cutting edge film color | Cobalt content (mass %) | Crystal grain size of WC | Surface roughness Ra (μm) | Surface roughness Ry (μm) | Macro-particle density (particles/mm$^2$) | Knoop hardness GPa | Metal ion bombard process | Interlayer |
|---|---|---|---|---|---|---|---|---|---|---|
| Sample 19 | 0.10 | Blue | 5 | 1.3 | 0.005 | 0.07 | 96000 | 32 | Yes | V |
| Sample 20 | 0.20 | Red | 6 | 1.2 | 0.018 | 0.20 | 110000 | 30 | No | No |

TABLE 2

|  | Peak below 1000 cm$^{-1}$ | I700/I1340 | S700/S1340 | I1340/I1560 | S1340/S1560 | Peak position in vicinity of 1560 cm$^{-1}$ (cm$^{-1}$) | Thrust resistance (%) (Non-coated: 100%) | Adhesion status at cutting edge |
|---|---|---|---|---|---|---|---|---|
| Sample 1 | Yes | 0.21 | 0.09 | 0.6 | 1.5 | 1571 | 61 | No adhesion |
| Sample 2 | Yes | 0.2 | 0.21 | 0.8 | 1.4 | 1570 | 54 | No adhesion |
| Sample 3 | Yes | 0.22 | 0.22 | 0.8 | 1.6 | 1570 | 55 | No adhesion |
| Sample 4 | Yes | 0.23 | 0.1 | 0.7 | 1.5 | 1569 | 64 | No adhesion |
| Sample 5 | Yes | 0.21 | 0.05 | 0.9 | 1.4 | 1568 | 62 | No adhesion |
| Sample 6 | Yes | 0.2 | 0.03 | 0.9 | 1.7 | 1570 | 59 | No adhesion |
| Sample 7 | Yes | 0.2 | 0.22 | 0.9 | 1.6 | 1571 | 68 | No adhesion |
| Sample 8 | Yes | 0.24 | 0.11 | 0.8 | 1.5 | 1572 | 63 | No adhesion |
| Sample 9 | Yes | 0.26 | 0.03 | 0.8 | 1.5 | 1570 | 52 | No adhesion |
| Sample 10 | Yes | 0.21 | 0.02 | 1 | 1.5 | 1570 | 56 | No adhesion |
| Sample 11 | Yes | 0.22 | 0.18 | 1 | 1.5 | 1570 | 66 | No adhesion |
| Sample 12 | Yes | 0.22 | 0.16 | 1.1 | 1.6 | 1570 | 57 | No adhesion |
| Sample 13 | Yes | 0.2 | 0.07 | 1 | 1.6 | 1569 | 61 | No adhesion |
| Sample 14 | Yes | 0.21 | 0.14 | 0.4 | 1.4 | 1567 | 60 | No adhesion |
| Sample 15 | Yes | 0.21 | 0.12 | 0.6 | 1.7 | 1570 | 69 | No adhesion |
| Sample 16 | Yes | 0.22 | 0.09 | 0.6 | 1.7 | 1571 | 64 | No adhesion |
| Sample 17 | Yes | 0.24 | 0.12 | 0.8 | 1.7 | 1571 | 61 | No adhesion |
| Sample 18 | Yes | 0.02 | 0.11 | 0.9 | 1.8 | 1570 | 62 | No adhesion |
| Sample 19 | Yes | 1.5 | 0.11 | 0.5 | 1.6 | 1571 | 65 | No adhesion |
| Sample 20 | Yes | 2.5 | 0.2 | 1 | 1.5 | 1569 | 63 | No adhesion |

TABLE 3

|  | Maximum film thickness at cutting edge (μm) | Cutting edge film color | Cobalt content (mass %) | Grain size of WC | Surface roughness Ra (μm) | Surface roughness Ry (μm) | Macro-particle density (particles/mm$^2$) | Knoop hardness GPa | Metal ion bombard process | Interlayer |
|---|---|---|---|---|---|---|---|---|---|---|
| Sample 21 | 0.12 | Silver | 5 | 1.2 | 0.006 | 0.06 | 105000 | 29 | Yes | NbCx |
| Sample 22 | 0.21 | Red | 5 | 1.5 | 0.015 | 0.12 | 98000 | 31 | No | No |
| Sample 23 | 0.20 | Red | 7 | 1.8 | 0.018 | 0.20 | 103000 | 33 | Yes | Nb |
| Sample 24 | 0.19 | Red | 6 | 1.3 | 0.016 | 0.13 | 93000 | 32 | No | No |
| Sample 25 | 0.19 | Red | 6 | 1.7 | 0.012 | 0.10 | 94000 | 31 | Yes | TaCx |
| Sample 26 | 0.18 | Red | 5 | 1.2 | 0.010 | 0.08 | 78000 | 30 | No | No |
| Sample 27 | 0.16 | Yellow | 5 | 1.5 | 0.008 | 0.07 | 74000 | 30 | Yes | Ta |
| Sample 28 | 0.22 | Red | 5 | 1.4 | 0.015 | 0.13 | 120000 | 31 | No | No |
| Sample 29 | 0.20 | Red | 5 | 1.5 | 0.022 | 0.23 | 112000 | 32 | Yes | MoCx |
| Sample 30 | 0.23 | Blue | 5 | 0.08 | 0.021 | 0.20 | 108000 | 31 | No | No |
| Sample 31 | 0.22 | Red | 6 | 4 | 0.018 | 0.15 | 112000 | 31 | Yes | Mo |
| Sample 32 | 0.21 | Red | 5 | 1.5 | 0.016 | 0.15 | 96000 | 31 | No | No |
| Sample 33 | 0.16 | Yellow | 5 | 1.3 | 0.008 | 0.09 | 73000 | 33 | Yes | WCx |
| Sample 34 | 0.22 | Red | 6 | 1.2 | 0.021 | 0.18 | 112000 | 32 | No | No |
| Sample 35 | 0.20 | Red | 5 | 1 | 0.015 | 0.16 | 124000 | 34 | Yes | W |
| Sample 36 | 0.23 | Blue | 5 | 1.1 | 0.022 | 0.19 | 140000 | 31 | No | No |
| Sample 37 | 0.22 | Red | 6 | 1.5 | 0.018 | 0.16 | 96000 | 30 | Yes | SiCx |
| Sample 38 | 0.21 | Red | 6 | 1.2 | 0.017 | 0.15 | 98000 | 30 | No | No |

TABLE 4

|  | Peak below 1000 cm$^{-1}$ | I700/I1340 | S700/S1340 | I1340/I1560 | S1340/S1560 | Peak position in vicinity of 1560 cm$^{-1}$ (cm$^{-1}$) | Thrust resistance (%) (Non-coated: 100%) | Adhesion status at cutting edge |
|---|---|---|---|---|---|---|---|---|
| Sample 21 | Yes | 0.24 | 0.01 | 0.3 | 1.5 | 1569 | 68 | No adhesion |
| Sample 22 | Yes | 0.22 | 1.5 | 0.7 | 1.6 | 1569 | 68 | No adhesion |
| Sample 23 | Yes | 0.25 | 2.5 | 0.4 | 1.8 | 1571 | 67 | No adhesion |
| Sample 24 | Yes | 0.22 | 0.06 | 0.1 | 1.3 | 1568 | 59 | No adhesion |
| Sample 25 | Yes | 0.22 | 0.03 | 0.5 | 1.5 | 1569 | 62 | No adhesion |

TABLE 4-continued

|  | Peak below 1000 cm$^{-1}$ | I700/I1340 | S700/S1340 | I1340/I1560 | S1340/S1560 | Peak position in vicinity of 1560 cm$^{-1}$ (cm$^{-1}$) | Thrust resistance (%) (Non-coated: 100%) | Adhesion status at cutting edge |
|---|---|---|---|---|---|---|---|---|
| Sample 26 | Yes | 0.23 | 0.02 | 1.2 | 1.4 | 1567 | 63 | No adhesion |
| Sample 27 | Yes | 0.22 | 0.11 | 1.1 | 0.3 | 1569 | 66 | No adhesion |
| Sample 28 | Yes | 0.2 | 0.08 | 1 | 1.5 | 1571 | 65 | No adhesion |
| Sample 29 | Yes | 0.21 | 0.08 | 0.9 | 3 | 1571 | 68 | No adhesion |
| Sample 30 | Yes | 0.22 | 0.09 | 1 | 1.4 | 1560 | 62 | No adhesion |
| Sample 31 | Yes | 0.19 | 0.15 | 0.9 | 1.5 | 1570 | 61 | No adhesion |
| Sample 32 | Yes | 0.2 | 0.14 | 0.8 | 1.4 | 1580 | 59 | No adhesion |
| Sample 33 | Yes | 0.59 | 0.5 | 0.7 | 1.3 | 1569 | 74 | No adhesion |
| Sample 34 | Yes | 0.48 | 1.11 | 0.8 | 1.2 | 1570 | 68 | No adhesion |
| Sample 35 | Yes | 0.79 | 0.69 | 0.8 | 1.2 | 1570 | 66 | No adhesion |
| Sample 36 | Yes | 1.11 | 0.79 | 0.6 | 1.2 | 1571 | 71 | No adhesion |
| Sample 37 | Yes | 1.23 | 1.11 | 0.7 | 1.1 | 1573 | 69 | No adhesion |
| Sample 38 | Yes | 1.49 | 1.08 | 0.3 | 1.1 | 1577 | 66 | No adhesion |

TABLE 5

|  | Maximum film thickness at cutting edge (μm) | Cutting edge film color | Cobalt content (mass %) | Grain size of WC | Surface roughness Ra (μm) | Surface roughness Ry (μm) | Macro-particle density (particles/mm$^2$) | Knoop hardness GPa | Metal ion bombard process | Interface Layer |
|---|---|---|---|---|---|---|---|---|---|---|
| Comparative Example 1 | 0.03 | Brown | 5 | 1.5 | 0.002 | 0.03 | 21000 | 30 | Yes | Ti |
| Comparative Example 2 | 0.60 | Red | 5 | 1.4 | 0.065 | 0.62 | 35000 | 31 | No | No |
| Comparative Example 3 | 0.20 | Red | 13 | 1.5 | 0.017 | 0.18 | 96000 | 32 | Yes | CrCx |
| Comparative Example 4 | 0.22 | Red | 5 | 1.4 | 0.020 | 0.21 | — | 18 | No | Si |
| Comparative Example 5 | TiN3 μm | Gold | 6 | 1.5 | 0.200 | 0.80 | — | 20 | Yes | No |
| Comparative Example 6 | TiAlN3 μm | Copper Red | 5 | 1.6 | 0.180 | 1.20 | — | 23 | Yes | No |
| Comparative Example 7 | non-coat | — | 5 | 1.7 | — | — | — | — | — | — |

TABLE 6

|  | Peak below 1000 cm$^{-1}$ | I700/I1340 | S700/S1340 | I1340/I1560 | S1340/S1560 | Peak position in vicinity of 1560 cm$^{-1}$ (cm$^{-1}$) | Thrust resistance (%) (Non-coated: 100%) | Adhesion status at cutting edge |
|---|---|---|---|---|---|---|---|---|
| Comparative Example 1 | Yes | 0.22 | 0.11 | 0.9 | 1.4 | 1569 | 99 | Adhesion at cutting edge |
| Comparative Example 2 | Yes | 0.2 | 0.08 | 0.3 | 1.5 | 1571 | 101 | Adhesion at cutting edge |
| Comparative Example 3 | Yes | 0.21 | 0.08 | 0.5 | 1.4 | 1571 | 98 | Adhesion at cutting edge |
| Comparative Example 4 | No | 0 | — | 1 | 1.5 | 1571 | 97 | Adhesion at cutting edge |
| Comparative Example 5 | No | — | — | — | — | — | 135 | chipping |
| Comparative Example 6 | No | — | — | — | — | — | 140 | chipping |
| Comparative Example 7 | — | — | — | — | — | — | 100 | chipping |

TABLE 7

| Workpiece material | A5052P |
|---|---|
| Cutting speed | 100 m/min |
| Feed | 0.5 mm/rev |
| Depth | 40 mm |
| Number of worked holes | 1000 holes |

The composition of A5052 in Table 7 is defined in the standards of JIS H4000.

It is appreciated from the results of Tables 2, 4 and 6 that the conventional TiN film (Comparative Example 5), the TiAlN film (Comparative Example 6), Comparative Example 4 corresponding to a hydrogenated amorphous carbon film containing 35 atomic % hydrogen formed by CVD and other comparative examples have a thrust resistance equal to that of a noncoated sample and is inferior in adhesion resistance. All the drills of the present invention (Samples 1–38) had a hydrogen content of 5 atomic % in the amorphous carbon coated film. This amount of hydrogen was evaluated by ERDA (Elastic Recoil Detection Analysis). It is appreciated that the drills of the present invention exhibited superior wear resistance as well as superior adhesion resistance in the process of aluminum boring. The accuracy of the bore after the boring process was extremely high. It is appreciated that the lifetime of the tool can be increased.

EXAMPLE 2

By means of a method identical to that of Example 1, the surface of a φ4 mm reamer made of cemented carbide was coated with an amorphous carbon film (film of Sample 2). The cemented carbide base of Example 2 includes 1% by mass of (Ta, Nb) C, and 7% by mass of Co. The hydrogen content in the amorphous carbon film is not more than 5 atomic %. As comparative examples, a hydrogenated amorphous carbon film by CVD (Comparative Example 4), a TiN film (Comparative Example 5) and a TiAlN film (Comparative Example 6) were deposited. Each of the surface coated reamers fabricated by the above-described method were used in the boring process of an aluminium die cast (ADC12) under the conditions shown in Table 8. The number of bores produced and the status of the cutting edge were evaluated.

TABLE 8

| Workpiece material | ADC12 |
|---|---|
| Cutting speed | 230 m/min |
| Feed | 0.15 mm/rev |
| Depth | 15 mm |

The composition of ADC12 in Table 8 is defined in the standards of JIS H5302.

Variation in the diameter of bores formed in the workpiece was noted after forming 600 bores using the conventional surface coated reamer (hydrogenated amorphous carbon film by CVD (Comparative Example 4)) and the metal nitride film formed by PVD (Comparative Examples 5 and 6). Upon checking the status of the reamer, it was found that the cutting edge was subject to wear and chipping was identified at the tip.

No problem was observed in the machining status of the workpiece even after forming 900 bores using the amorphous carbon coated reamer of Sample 2 of the present invention. No wear or chipping was identified at the cutting edge of the reamer of the present invention.

EXAMPLE 3

The surface of a φ7 mm end mill made of cemented carbide was coated with an amorphous carbon film (film of Sample 3 of the present invention), fabricated by a method identical to that of Example 1. The cemented carbide base contains 1% by mass of (Ta, Nb) C and 7% by mass of Co. The hydrogen content in the amorphous carbon film is not more than 5 atomic %. As comparative examples, a hydrogenated amorphous carbon film by CVD (Comparative Example 4), a TiN film (Comparative Example 5), and a TiAlN film (Comparative Example 6) were deposited. Using each of the surface coated end mills fabricated by the above-described method, end milling is effected on an aluminium die cast (ADC12) under conditions shown in Table 9. The cutting length and the status of the cutting edge before deviation from the tolerance of the surface roughness of the workpiece were evaluated. In Table 9, Ad (axial depth of cut) is the depth of cut in the axial direction whereas Rd (radial depth of cut) is the depth of cut in the radial direction.

TABLE 9

| Workpiece material | ADC12 |
|---|---|
| Cutting speed | 300 m/min |
| Feed | 0.1 mm/rev |
| Depth of cut | Ad = Rd = 5 mm |

The composition of ADC12 in Table 9 is defined in the standards of JIS H5302.

Among the conventional surface coated end mills, the hydrogenated amorphous carbon film by CVD (Comparative Example 4) and the metal nitride films formed by PVD (Comparative Examples 5 and 6) exhibited deviation from the tolerance in surface roughness at 20 m, 5 m and 6 m, respectively. Therefore, determination was made that the lifetime of these tools has expired. Aluminum adhering to the leading edges of the surface coated end mills that had expired lifetime was removed and studied. It was found that the coated film is no longer present, and the WC base cemented carbide of the base was exposed.

In contrast, the surface roughness of the workpiece was maintained within the tolerance even after 800 m was cut using the end mill of Sample 3 of the present invention. It was expected that the lifetime is further increased.

EXAMPLE 4

The back side of an indexable insert was coated with an amorphous carbon film (coated film of Sample 2 of present invention) according to a method identical to that of EXAMPLE 1. The cemented base included 1% by mass of (Ta, Nb) C and 6% by mass of Co. The hydrogen content in the amorphous carbon film was not more than 5 atomic %. As comparative examples, a hydrogenated amorphous carbon film by CVD (Comparative Example 4), TiN film (Comparative Example 5) and TiAlN film (Comparative Example 6) were coated. Each of the surface coated indexable insert 1 fabricated by the above-described method was attached to a holder having a tool diameter of 32 mm and used for an end mill process on an aluminium die cast (A390) under the conditions shown in Table 10. The cutting length and status of the cutting edge before the surface roughness of the workpiece deviated from the tolerance were evaluated. In Table 10, Ad (axial depth of cut) is the depth of cut in the axial direction, and Rd (radial depth of cut) is the depth of cut in the radial direction).

TABLE 10

| Workpiece material | A390 |
|---|---|
| Cutting speed | 200 m/min |
| Feed | 0.1 mm/rev |
| Depth of cut | Ad = Rd = 3 mm |

A390 in Table 10 has the composition of Al-16~18% (m/m) Si.

As to the conventional surface coated end mills, the surface roughness of the hydrogen amorphous carbon film by CVD (Comparative Example 4), and the metal nitride film formed by PVD (Comparative Examples 5 and 6) deviated from the surface roughness tolerance at 15 m, 4 m and 2 m, respectively. Accordingly, determination was made that the lifetime of the tools has expired. Aluminum adhering to the tip of the surface coated insert determined as having expired lifetime was removed and examined. It was found that the coated film is no longer present and the WC base cemented carbide of the base was exposed.

The end mill of Sample 2 of the present invention exhibited deviation in the surface roughness tolerance of the workpiece when cutting has been effected for 900 m. Accordingly, determination was made that the lifetime of that tool has expired when the length of 900 m has been cut.

It will be understood that the above description is merely exemplary, and is also applicable to rotating tools of other configuration (drills, end mills, reamer, and the like), indexable inserts used for milling cutters and turning tools, and cutting-off tools (cutters, knives, splitters, and the like).

By defining the composition of the base material and the thickness of the amorphous carbon film in the coated tool of the present invention, the tool of the present invention maintains wear resistance and exhibits superior adhesion resistance. Thus, the cutting and wear resistance of the tool of the present invention can be greatly increased. Particularly, by using an amorphous carbon film absent of hydrogen, the wear resistance and adhesion resistance can further be improved. Thus, the potential of effective usage towards rotating tools (drills, end mills, reamers and the like), and indexable insert used for milling cutters and turning tools, and cutting-off tools (cutters, knives, slitters, and the like) exist.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amorphous carbon coated tool comprising:
 a base material consisting of a cemented carbide based on tungsten carbide and having a cobalt content of not more than 12% by mass, wherein said base material has a shape including a cutting edge;
 an amorphous carbon film disposed over and covering at least said cutting edge of said base material, wherein said amorphous carbon film has a hydrogen content of not more than 5 atomic % and a maximum thickness from 0.05 $\mu$m to 0.5 $\mu$m at said cutting edge; and
 an interlayer disposed between said base material and said amorphous carbon film, wherein said interlayer comprises at least one element selected from the group consisting of the elements of Groups IVa, Va, VIa and IIIb of the periodic table and the elements excluding carbon of Group IVb of the periodic table, or at least one carbide of said at least one element, and wherein said interlayer has a thickness of at least 0.5 nm and less than 10 nm.

2. The amorphous carbon coated tool according to claim 1, wherein said interlayer consists of said at least one element or said at least one carbide.

3. The amorphous carbon coated tool according to claim 1, wherein said amorphous carbon film consists of substantially only carbon.

4. The amorphous carbon coated tool according to claim 1, wherein a density of macro-particles present at a surface of said amorphous carbon film is not more than $3 \times 10^5$ particles/mm$^2$.

5. The amorphous carbon coated tool according to claim 1, wherein said maximum thickness of said amorphous carbon film at said cutting edge is not more than 0.25 $\mu$m, and said cutting edge corresponds to a cutting edge of said tool that is adapted to carry out cutting.

6. The amorphous carbon coated tool according to claim 1, wherein said base material has said cobalt content being at least 3% by mass and not more than 7% by mass.

7. The amorphous carbon coated tool according to claim 1, wherein said base material is a sintered material and contains grains of tungsten carbide, and said grains of tungsten carbide have an average crystal grain size of at least 0.1 $\mu$m and not more than 3 $\mu$m after said base material is sintered.

8. The amorphous carbon coated tool according to claim 1, wherein said base material includes at least 0.01% by mass and not more than 3% by mass of a compound comprising at least one first element selected from the group consisting of metal elements from Groups IVa, Va and VIa of the periodic table, and at least one second element selected from the group consisting of carbon and nitrogen.

9. The amorphous carbon coated tool according to claim 1, wherein said amorphous carbon film has a surface roughness Ra of at least 0.002 $\mu$m and not more than 0.05 $\mu$m.

10. The amorphous carbon coated tool according to claim 1, wherein said amorphous carbon film has a surface roughness Ry of at least 0.02 $\mu$m and not more than 0.5 $\mu$m.

11. The amorphous carbon coated tool according to claim 1, wherein said amorphous carbon film has a Knoop hardness of at least 20 GPa and not more than 50 GPa.

12. The amorphous carbon coated tool according to claim 1, wherein said amorphous carbon film has a peak in a wave number range from 400 cm$^{-1}$ to 1000 cm$^{-1}$ in a Raman spectrum obtained by Raman spectroscopic analysis using an argon ion laser having a wavelength of 514.5 nm.

13. The amorphous carbon coated tool according to claim 12, wherein said amorphous carbon film has an intensity ratio (I700/I1340) of the intensity of said peak located in said wave number range from 400 cm$^{-1}$ to 1000 cm$^{-1}$ (I700) relative to the intensity of a peak located around 1340 cm$^{-1}$ (I1340) in said Raman spectrum, said intensity ratio being at least 0.02 and not more than 2.5.

14. The amorphous carbon coated tool according to claim 12, wherein said amorphous carbon film has an intensity ratio (S700/S1340) of the integrated intensity of said peak located in said wave number range from 400 cm$^{-1}$ to 1000 cm$^{-1}$ (S700) relative to the integrated intensity of a peak located around 1340 cm$^{-1}$ (S1340) in said Raman spectrum, said intensity ratio being at least 0.01 and not more than 2.5.

15. The amorphous carbon coated tool according to claim 12, wherein said amorphous carbon film has an intensity ratio (I1340/I1560) of the intensity of a peak located around 1340 cm$^{-1}$ (I1340) relative to the intensity of a peak located around 1560 cm$^{-1}$ (I1560) in said Raman spectrum, said intensity ratio being at least 0.1 and not more than 1.2.

16. The amorphous carbon coated tool according to claim 12, wherein said amorphous carbon film has an intensity ratio (S1340/S1560) of the integrated intensity of a peak located around 1340 cm$^{-1}$ (S1340) relative to the integrated intensity of a peak located around 1560 cm$^{-1}$ (S1560) in said Raman spectrum, said intensity ratio being at least 0.3 and not more than 3.

17. The amorphous carbon coated tool according to claim 12, wherein said amorphous carbon film further has a peak located around 1560 cm$^{-1}$ comprising a peak in a wave number range from 1560 cm$^{-1}$ to 1580 cm$^{-1}$ in said Raman spectrum.

18. The amorphous carbon coated tool according to claim 1, wherein said amorphous carbon film is transparent in a visible region, and exhibits at least one interference color.

19. The amorphous carbon coated tool according to claim 18, wherein said at least one interference color is selected from the group consisting of magenta, violet, blue violet, blue, silver, yellow, red, and green.

20. The amorphous carbon coated tool according to claim 1, herein said interlayer includes at least one element selected from the element group consisting of Ti, Zr, Hf, V, Nb, Ta, Cr, Mo, W and Si, or a carbide of at least one element selected from said element group.

21. The amorphous carbon coated tool according to claim 1, further comprising an additional layer disposed between said interlayer and said amorphous carbon film, wherein said additional layer is either a mixed composition layer having a composition made up of a mixture of components from said interlayer and from said amorphous carbon film, or a gradient composition layer having a continuously varying composition.

22. The amorphous carbon coated tool according to claim 1, adapted to carry out working or machining of workpiece materials comprising at least one of soft metals, non-ferrous metals, organic materials, materials containing hard particles, and printed circuit boards, or to carry out bi-metallic cutting of a ferrous metal and a soft metal.

23. The amorphous carbon coated tool according to claim 1, being a tool selected from the group consisting of drills, micro-drills, end mills, indexable inserts for end mill processing, indexable inserts for milling cutting, indexable inserts for turning, metal saws, gear cutters, reamers, and taps.

* * * * *

UNITED STATES PATENT AND TRADEMARK OFFICE
CERTIFICATE OF CORRECTION

PATENT NO. : 6,881,475 B2
DATED : April 19, 2005
INVENTOR(S) : Satoshi Ohtani et al.

It is certified that error appears in the above-identified patent and that said Letters Patent is hereby corrected as shown below:

Title page,
Item [56], References Cited, OTHER PUBLICATIONS, "R. Kalish et al.," reference, after "2936-2938" replace "XP00083705," with -- XP000834705, --

Column 1,
Line 24, before "with" replace "workplace" with -- workpiece --
Line 37, after "board or" replace "bimetallic" with -- bi-metallic --

Column 6,
Line 30, after "indicated by" replace "1700" with -- I700 --

Column 7,
Line 3, after "1340" replace "cm⁻" with -- $cm^{-1}$ --
Line 5, after "$sp^2/sp^3$" insert -- ratio, -- before "representing"

Column 10,
Line 27, before "Comparative" insert -- In --

Column 17,
Line 63, replace "$3 \times 10^5$" with -- $3 \times 10^5$ --

Column 19,
Line 9, after "1," replace "herein" with -- wherein --

UNITED STATES PATENT AND TRADEMARK OFFICE
CERTIFICATE OF CORRECTION

PATENT NO. : 6,881,475 B2
DATED : April 19, 2005
INVENTOR(S) : Satoshi Ohtani et al.

It is certified that error appears in the above-identified patent and that said Letters Patent is hereby corrected as shown below:

Column 20,
Line 16, please insert the following:

24. A tool comprising:
a base material consisting of a cemented carbide based on tungsten carbide and having a cobalt content of not more than 12% by mass, wherein said base material has a shape including a cutting edge;
an amorphous carbon film disposed over and covering at least said cutting edge of said base material, wherein said amorphous carbon film has a maximum thickness from 0.05 μm to 0.5 μm at said cutting edge, and has been formed by physical vapor deposition with graphite as a carbon source material in an atmosphere substantially free of hydrogen; and
an interlayer disposed between said base material and said amorphous carbon film, wherein said interlayer comprises at least one element selected from the group consisting of the elements of Groups IVa, Va, VIa and IIIb of the periodic table and the elements excluding carbon of Group IVb of the periodic table, or at least one carbide of said at least one element, and wherein said interlayer has a thickness of at least 0.5 nm and less than 10 nm.

Signed and Sealed this

Twelfth Day of July, 2005

JON W. DUDAS
*Director of the United States Patent and Trademark Office*

UNITED STATES PATENT AND TRADEMARK OFFICE
CERTIFICATE OF CORRECTION

PATENT NO.    : 6,881,475 B2
DATED         : April 19, 2005
INVENTOR(S)   : Ohtani et al.

It is certified that error appears in the above-identified patent and that said Letters Patent is hereby corrected as shown below:

Title page,
Item [56], References Cited, OTHER PUBLICATIONS,
"S. Santavirta et al." reference, replace "ISSN: 095-9635." by -- ISSN: 0925-9635. --.

Signed and Sealed this

Twentieth Day of December, 2005

JON W. DUDAS
*Director of the United States Patent and Trademark Office*